United States Patent
McGuire et al.

(10) Patent No.: US 7,224,039 B1
(45) Date of Patent: May 29, 2007

(54) POLYMER NANOCOMPOSITE STRUCTURES FOR INTEGRATED CIRCUITS

(75) Inventors: Gary E. McGuire, Chapel Hill, NC (US); Olga Alexander Shenderova, Raleigh, NC (US)

(73) Assignee: International Technology Center, Raleigh, NC (US)

( * ) Notice: Subject to any disclaimer, the term of this patent is extended or adjusted under 35 U.S.C. 154(b) by 35 days.

(21) Appl. No.: 10/936,743

(22) Filed: Sep. 8, 2004

Related U.S. Application Data

(60) Provisional application No. 60/501,646, filed on Sep. 9, 2003.

(51) Int. Cl.
*H01L 29/00* (2006.01)
(52) U.S. Cl. .............. 257/532; 257/506; 257/E51.04; 205/109; 205/123
(58) Field of Classification Search ........... 205/109, 205/123; 257/E51.04, 532, 506
See application file for complete search history.

(56) References Cited

U.S. PATENT DOCUMENTS

| | | | | |
|---|---|---|---|---|
| 5,404,835 | A | * | 4/1995 | Yoder .................. 117/79 |
| 5,638,251 | A | * | 6/1997 | Goel et al. ............. 361/313 |
| 5,897,945 | A | * | 4/1999 | Lieber et al. ............ 428/323 |
| 6,483,125 | B1 | | 11/2002 | Brousseau, III |
| 6,616,794 | B2 | * | 9/2003 | Hartman et al. ......... 156/306.9 |
| 2002/0100578 | A1 | | 8/2002 | Withers et al. |
| 2003/0102222 | A1 | * | 6/2003 | Zhou et al. .............. 205/109 |
| 2005/0045855 | A1 | * | 3/2005 | Tonapi et al. ............ 252/500 |
| 2005/0082523 | A1 | * | 4/2005 | Blanchet-Fincher et al. .. 257/40 |
| 2005/0158549 | A1 | | 7/2005 | Khabashesku et al. |

OTHER PUBLICATIONS www.nciproto.com/info/Base+mat.htm.*
Dolmatov, Detonation synthesis ultradispersed diamonds: properties and applications, Russian Academy of Sciences and Turpion Ltd., 2001.
Shenderova, et al., "Would Diamond Nanorods Be Stronger than Fullerene Nanotubes?", May 1, 2003, American Chemical Society. Web page printout from Diamond Centre web site, two pages, date unknown.
"Polymethylmethacrylate-montmorillonite Composites: Preparation, Characterization and Properties", Salahuddin et al., Polymer 42, 2001, pp. 8379-8385.
"Studies on Thermal and Mechanical Properties of Polyimide-Clay Nanocomposites", Agag et al., Polymer 42, 2001, pp. 3399-3408.
"Polymer Nanocomposites: Status and Opportunities", Vaia et al., MRS Bulletin, May 2001, pp. 394-401.
"Thermal Properties of Carbon Nanotubes and nanotube-based materials", Hone et al., Appl. Phys. A 74, 2002, pp. 339-343.

(Continued)

*Primary Examiner*—Michelle Estrada
*Assistant Examiner*—Nicholas J. Tobergte
(74) *Attorney, Agent, or Firm*—Miller Patent Services; Jerry A. Miller

(57) ABSTRACT

In accordance with certain embodiments consistent with the present invention, diamond nanoparticles are mixed with polymers. This mixture is expected to provide improved properties in interlayer dielectrics used in integrated circuit applications. This abstract is not to be considered limiting, since other embodiments may deviate from the features described in this abstract.

15 Claims, 2 Drawing Sheets

OTHER PUBLICATIONS

"Carbon Nanotube Composites for Thermal Management", Biercuk et al., Applied Physics Letters, vol. 80, No. 15, Apr. 15, 2002, pp. 2767-2769.

"Adhesives for Elevated-Temperature Applications", Millington et al., MRS Bulletin, Jun. 2003, pp. 428-433.

"Low Dielectric Constant Porous Diamond Films Formed by Diamond Nanoparticles", Sakaue et al., Applied Physics Letters, vol. 83, No. 11, Sep. 15, 2003, pp. 2226-2228.

"Self-organization in Nanocomposites Based on Detonation Nanodiamonds", Voznyakovskii, Physics of Solid State, vol. 46, No. 4, 2004, pp. 644-648.

"Model of Formation of Three-Dimensional Polyurethane Films Modified by Detonation Nanodiamonds", Sirotinkin, et al., Physics of Solid State, vol. 46, No. 4, 2004, pp. 746-747.

* cited by examiner

POLYMER NANOCOMPOSITE STRUCTURES FOR INTEGRATED CIRCUITS

CROSS REFERENCE TO RELATED DOCUMENTS

This application is related to and claims priority benefit of U.S. Provisional Patent Application No. 60/501,646 to McGuire et al., filed Sep. 9, 2003 which is hereby incorporated herein by reference.

STATEMENT REGARDING FEDERALLY FUNDED RESEARCH OR DEVELOPMENT

The U.S. Government has a paid-up license to certain embodiments of inventions disclosed herein, and the right in limited circumstances to require the patent owner to license others on reasonable terms as provided for by the terms of subcontract number 130G106095-B granted under prime grant number N66001-01-C-8034. Certain inventions disclosed and claimed herein, were developed outside the scope of the above contracts.

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

BACKGROUND

Polymers are candidates for use as inter-level and intra-layers dielectric materials in integrated circuits (ICs) and as bonding layers in packaging applications and in three-dimensional integration (3-D) of ICs. Polymer materials are typically poor thermal conductors and as a result act a thermal barrier to heat flow to more thermally conducting layers or structures. In addition polymers commonly suffer from thermal stability problems when the dielectric is heated during subsequent processing of the integrated circuit or during packaging.

In the inter-level and intra-level dielectic applications of polymers, candidate materials should possess a low dielectric constant (k) in order to minimize the impact of capacitive coupling on the performance of the IC especially as IC dimensions are reduced through scaling. Often the polymer chains are modified to add chemical functional groups such as fluorine to lower their k. Due to the higher level of fluorine content in such candidate low-k polymers such as bisbenzocyclobutene (BCB), perfluorocyclobutane (PFCB), poly(tetrafluoroethylene) (PTFE), adhesion to prior and subsequent layers is often a problem.

As IC feature sizes are scaled to smaller dimensions and the ICs operate at higher frequencies, devices are projected to generate more heat and subsequently experience higher temperatures during operation. As a result, the thermal conductivity of polymers used as inter-level and intra-level dielectrics and as adhesives for bonding and mounting should be improved in order to conduct heat away from the integrated circuit.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which.

DETAILED DESCRIPTION

Figure 1:
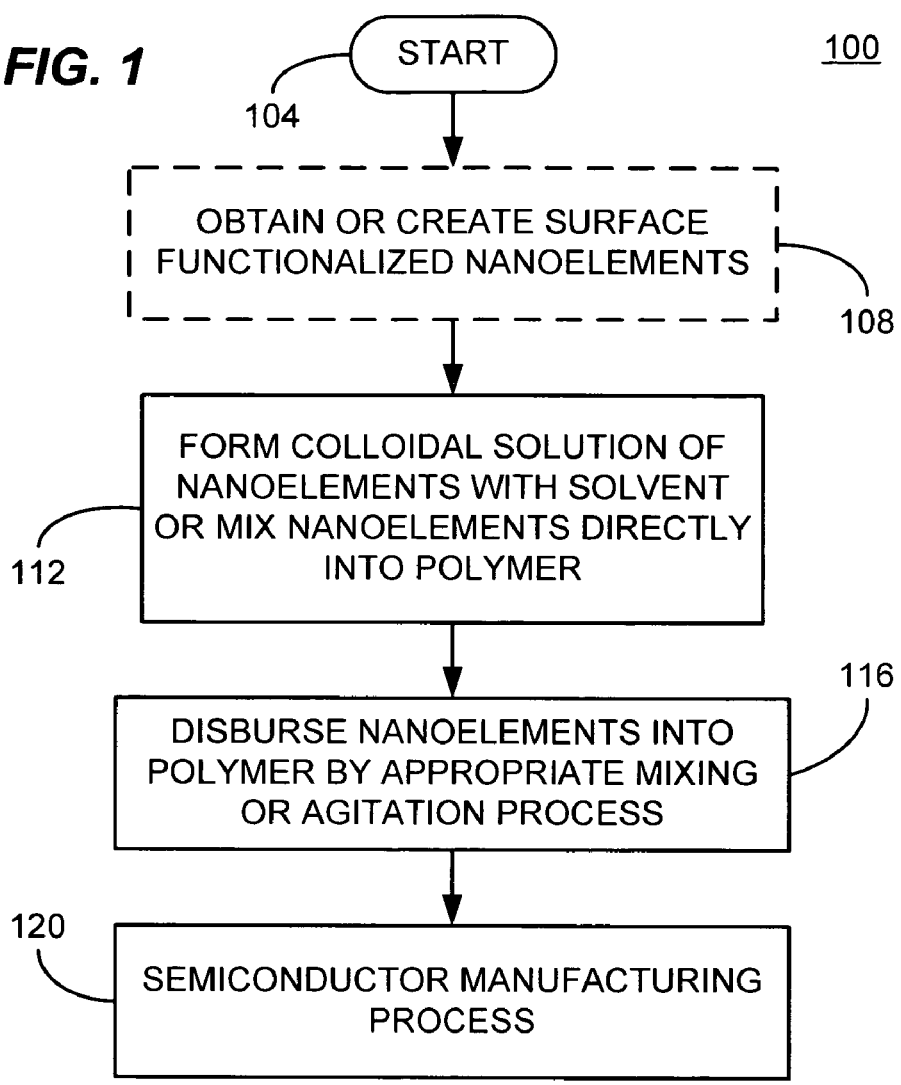
FIG. 1 is a flow chart describing a process consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

The present invention, in accordance with certain embodiments thereof, relates to improving the thermal properties of the polymer-based materials used in any arrangement of IC fabrication (either 2-dimensional (2-D) integrated circuits or 3-dimensional (3-D) stacked chips) or packaging resulting from additions of nanoparticles or nanorods (referred to as nanoelements) to a polymer. One or more of the problems described above may be addressed in certain embodiments of the invention, but the invention should not be limited to embodiments that achieve such improvements.

Use of the suggested nanoelements originated from the specific need for thermal management in integrated circuits. One of the major obstacles to heat removal from the die is the high thermal resistivity of layers containing polymer material. The inability to remove heat generated by device operations quickly and efficiently results in an overall temperature rise which may cause material degradation especially in polymers that are used as inter-level dielectrics in multilevel metallization schemes or as bonding layers for stacked die in three-dimensional integration schemes. Thus there is a need to increase the thermal conductivity for polymer materials utilized in ICs as well as a need to increase their glass transition and degradation temperatures. Improvement of mechanical stability and adhesion with other materials used in IC fabrication would also be beneficial.

At the same time, nanocomposite formulations for such inter-level dielectrics should be non-conductive in order to avoid the possibility of short-circuiting the IC and have a low K to avoid raising the dielectric constant of a host polymer matrix. From this perspective, carbon nanotubes are not as attractive for the present purposes in inter-level dielectrics despite their record of thermal conductivity, since they may possess high electrical conductivity. Non-conducting nanotubes might be attractive for this application if prepared at high purity. Similarly diamond nanorods are also attractive for this application due to their high thermal conductivity. For low dielectric constant interlayer dielectrics dielectric permittivity should not significantly increase after addition of the nanoelements.

The sizes of particles, particles agglomerates, as well as diameters of nanorods can range from several nanometers to hundreds of nanometers. The length of nanorods can span the nanometer to micrometer scale. The most preferable type of nanoelements identified to date as candidates for this application are diamond nanoparticles (such as, for example, those obtained by detonation synthesis) as well as diamond nanorods (for example, grown from the vapor phase or etched out of the diamond film). Such nanoparticles are commonly in the range of approximately 5 nm in their largest dimension. Dimensions of diamond nanorods synthesized so far span the size range of a few tens of nanometers. The desirable diameter of nanoparticles and nanorods and lengths of nanorods depends upon the specific application of the polymer nanocomposite. When the nanocomposite is utilized as an interlevel or intralevel dielectric the size of the nanoparticle should be small relative to the dimensions of the IC features into which they are incorporated. These dimensions typically decrease with each succeeding generation of IC. The nanoparticle should be small enough to not impact processes such as deposition of the nanocomposite by spin coating and to not physically penetrate, block or interfere with the formation of the adjacent over-layer, under-layer or neighbor features of the device.

Diamond-based nanoelements possess exceptional mechanical properties, are inexpensive, have superior thermal stability (up to 1300–1800 K in vacuum), as well as very high thermal conductivity (~2000 W/mK at room temperature for bulk diamond). Non-carbon nanoelements (such as silicon, silicon carbide, boron nitride and other different carbides and nitrides) can be also used, provided that they are uniformly dispersed in the matrix, increase its glass transition and degradation temperatures or improve its thermal conductivity, or both.

Polymer materials that are believed to exhibit improved properties as the matrix in nanocomposites, are materials such as, polyimide, bisbenzocyclobutene, perfluorocyclobutane, poly(tetrafluoroethylene) and others known in the art as candidates for inter-level dielectrics. Another class of nanocomposite polymer materials with improved properties is those used for bonding of ICs by gluing, for example, as a mechanism of attaching an IC to a substrate such as a printed circuit board or other package. Another class of nanocomposite materials is those used for stacking two or more ICs to produce three-dimensional integration of ICs.

It is expected that the dielectric constant of interlayer dielectrics will not be significantly affected because first, the volumetric fraction of nanoelements in the composite is expected to be in the range of several percent, and, second, the dielectric permittivity for ultrananocrystalline diamond films has been reported to be lower for nanoscopic sizes of material than bulk materials.

An increase of the degradation temperature of polymers used in microelectronics, including degradation due to thermocycling, will also result in a wider range of allowable processing temperatures during fabrication of 2-D or 3-D integrated circuits as well as packaging.

Nanocomposites can be fabricated by different methods. One such method is to first disperse the nanoelements in a solvent compatible with the polymer solution (for the purpose of depositing the polymer it can be dissolved in a suitable solvent; the viscosity of the polymer solution is controlled by the amount of polymer and solvent) to form a colloidal suspension. The colloidal solution containing the nanoelements is added to the polymer solution in the required fraction and then this mixed solution can be processed as necessary for a given type of polymer and application in ICs. Ultrasonic agitation or other means of agitation can be used to achieve a better distribution of the nanoelements/polymer solutions before and/or after mixing. It may also be possible to add the nanoelements directly to the polymer solution followed by agitation; there is current research aimed at the development of nanoelements that have been functionalized such that they may be directly dispersed in appropriate polymer solutions without the need to formulate an intermediate colloidal solution.

Diamond nanoparticles are currently believed to be the best candidate nanoelements since the diamond's surface can be functionalized to facilitate suspension of the nanoelements in an appropriate solvent to appropriately mix in a uniform manner with the polymer at hand, but this should not be considered limiting since other candidates may also prove to be appropriate. The surface properties of diamond nanoparticles are believed to be particularly advantageous. Nanodiamond can be specifically modified so that it contains predominantly surface groups from a list of: OH, COOH, NH2, etc. For example, if ND particles have predominant —OH functional groups, and polymer macromolecules contain —OH side or end groups (as for example in inorganic polymers), silane molecules (such as hexachlorodisiloxane: $SiCl_3OSiCl_3$) can be used for crosslinking between the ND and polymer matrix.

While the primary research objective that initially resulted in discovery of the use of diamond nanoparticles was the improved thermal stability of polymers, it is believed that certain polymers will exhibit improvement in either thermal stability, adhesion and/or thermal conductivity when such nanoelements are added.

Candidate nanoelements for interlayer integrated circuit applications likely will exhibit some or all of the following characteristics:
 primary particle size<approximately 10 nm
 low dielectric constant
 non-conductive
 thermally stable
 mechanically rigid
 chemically stable
 easily functionalized
 inexpensive
 form agglomerate-free suspension in a related solvent Diamond nanoparticles appear to be a superior candidate with other nanoparticles such as silicon carbide being another good candidate. Diamond nanoparticles appear to be particularly attractive at this time in part due to the ability to carry out surface modification. This is done by (controlled) changing of functional groups on the surface and can be used to facilitate making the particles amenable to attachment to other materials such as the polymer of interest or to enhance their dispersion in a solvent compatible with the polymer of interest in order to produce a colloidal solution of diamond particles that can be mixed readily with the polymer solution.

FIG. 1, illustrates the basic process 100 contemplated for producing modified polymer compositions consistent with certain embodiments and using such compositions in a semiconductor manufacturing process. In this process, starting at 104, suitable nanoelements are manufactured, modified or otherwise obtained at 108. Such nanoelements may or may not have surface functionalization as indicated by the dashed lines surrounding this block. At 112, the nanoelements may be mixed directly into the polymer solution or a colloidal solution of the nanoelements and a suitable solvent (suitable for dissolving the polymer) is created in order to suspend the nanoelements in the solvent. The nanoelements are then disbursed within the polymer by appropriately mixing the colloidal solution with the polymer at 116. This modified polymer solution is then used in a semiconductor process in a manner similar to an analogous process in which an unmodified polymer solution would be used.

Figure 2:
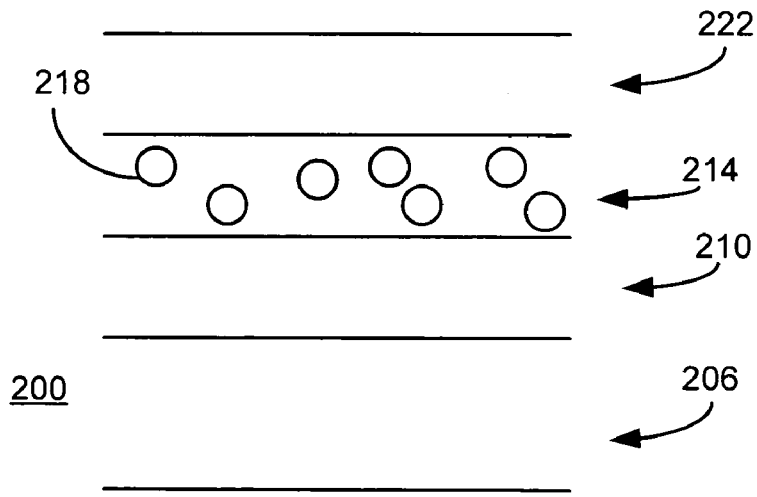
FIG. 2 illustrates a section of a semiconductor device utilizing an interlayer dielectric with nanoelements in a manner consistent with certain embodiments of the present invention.

It is noted that since such introduction of nanoelements may enhance the thermal conductivity of the cured polymer. This is an attractive feature for any of the mentioned applications of the material as an inter-level or intra-level dielectrics or as a adhesive or bonding materials for packaging or stacking of ICs to produce 3-D ICs. One candidate polymer for use in a semiconductor process consistent with certain embodiments comprises an epoxy or other bonding or sealing agent, for example such as would be used to bond a semiconductor to it's packaging. Additionally, as depicted in FIG. 2, as a section of a semiconductor device 200, the polymer may be used in an inter-layer dielectric. In device 200, a substrate 206 has a layer of metal 210 bonded thereto in a conventional manner. Layer 214 represents an interlayer dielectric containing nanoelements 218, sandwiched between layer 210 and layer 222.

The present invention should not be considered bound by any discussion herein of theory of operation, but that said, the operation of nanoelements in this application is believed to provide beneficial results as follows. Using polymer nanocomposites (PNCs) is a radical alternative to conventional polymer composites which has emerged during the last decade as a class of polymers containing a uniform dispersion of nanoelements (either spherical, rod-like or plate-like) with characteristic sizes typically less than a hundred nanometers. For example, the development of silicate nanocomposites resulted in a doubling in tensile modulus and strength and up to a 100° C. increase in the maximum service temperature of the polymer, thereby extending its use to higher temperature environments, such as under-the-hood structural components in automobiles [see R. Vaia, E. Giannelis, Polymer Nanocomposites: Status and Opportunities, *MRS Bulletin* 26, 394 (2001) and *Polymer Nanocomposites*, edited by R. A. Vaia and R. Krishnamoorti (American Chemical Society, Washington, D.C., 2001).

Due to the nanoscopic size of nanoelements, the matrix/element interfacial region, which represents an insignificant volume fraction of the matrix in traditional composites, becomes the dominant bulk phase in a polymer nanocomposite containing only a few volume percent of dispersed nanoelements. It is estimated that perhaps in general that the nanoparticles will represent less than 10% by weight and likely between approximately 0.5% and 5% by weight of the PNC. Nanoparticles represented 0.5%, 1% and 2% in experiments conducted to date with polymethylmethacrolate (PMMA) polymer being used as an example polymer. Within the current nanocomposite concept, there are believed to be three major characteristics defining the PNCs performance: a nanoscopically confined polymer matrix, nanoscale inorganic reinforcing elements, and the nanoscale arrangement of these elements. The extent of the effect of the nanoelements on the properties of the surrounding matrix is believed to be related to a fundamental length scale of the adjacent matrix, which for polymers is on the order of the radius of gyration of a molecular chain (5–10 nm). The distances between reinforcing elements in composites with a few volume percent of nanoelements are of the same order of magnitude as the radius of gyration.

Therefore, it appears that a majority of polymer molecules reside near nanoelements. Since an interface limits the number of conformations of a polymer molecule, the entire matrix may be considered to be nanoscopically confined. These restrictions on chain conformations are believed to alter molecular mobility, relaxation behavior, free volume and thermal transitions. Thus configurational confinement provided by nanoelements is believed to result in increased thermal stability of the polymer composite. In this sense mechanically and thermally stable nanoelements well dispersed in the matrix are believed to provide a beneficial effect. Formation of chemical bonds between polymer molecules and rigid ND particles also will reduce mobility of the chain molecules and improve overall rigidity of the matrix resulting in enhanced mechanical and. thermal properties. In addition, if the nanoelements posses (internal) high thermal conductivity, they are believed to provide thermal conductivity of the matrix at concentrations above their percolation threshold. In this content, it is believed that the most enhanced properties of a PNC matrix can be obtained through the use of diamond nanorods but can be enhanced through the utilization of other nanoelements in the PNC.

In addition, nanodiamond-based nanoelements are expected to provide significant influence on polymer properties, since the surface of nanodiamond elements contain a significant amount of carbon sites for bonding with the matrix and therefore, profoundly affect its properties. Nanodiamond-based nanoelements are readily functionalized as, for example, is the case for carbon nanotubes. Due to the abundance of surface functional groups on ND, it can be expected that ND will improve adhesion between polymer matrix and surrounding materials playing a role for example, of a crosslinking element.

As previously stated, embodiments of the present invention should not be constrained by the theory of operation as described herein.

EXAMPLES

Example 1

As an experimental model of the use of diamond nanoparticles with a polymer, PMMA photo-resist was used. Thermal gravimetric analysis (TGA) that provides the change in the weight of a sample as the temperature was increased was used as a metric of thermal stability. The results are tabulated below in TABLE I with percentages of diamond nanoparticles (ND) expressed on the basis of weight.

In a first set of experiments, 0.5 mass. % ND suspensions were prepared at ITC using commercially available ND powder obtained from a vendor. The dispersion of ND particles in the anisole suspension was accomplished by ultrasonication (several hrs); the extent of dispersion was not determined but ND agglomerates of 1–2 microns were still observed. It should be noted that agglomeration of the nano-constituents in preparation of nanocomposites, as revealed by microscopic analysis, is not an unusual problem. In principle, since the primary ND particle size is ~5 nm, nanocomposites with ND agglomerates as small as tens of nanometers are possible. After mixing of ND suspension in anisole with PMMA solution in anisole (PMMA was chosen as a first test of the concept because of its low thermal stability), the final solution was poured on aluminum foil and baked in an oven for 0.5 hrs. This procedure was used instead of a spin-coating on a Si wafer followed by hot plate cure, because thermal gravimetric analysis requires very small polymer samples (several milligrams quantity). The polymer film can be easily removed from the surface of aluminum foil so that the required amount of polymer sample for TGA can be easily provided.

After annealing the polymer samples, it was observed that micron-sized ND agglomerates were distributed in the polymer rather non-uniformly and the size of agglomerates increased as compared to the ND suspension. Then, standard PMMA (also poured on aluminum foil followed by annealing for comparison) as well as PMMA/ND composites were subjected to TGA analysis. Both samples were tested in duplicate and run at a 20 C/min heating rate in an $N_2$ atmosphere. Thermograms for standard PMMA samples and PMMA/ND composites were then done. Based on the analysis of the thermograms, it can be concluded that ND does increase the temperature of degradation of PMMA by 10–15 degrees for 1% polymer weight loss.

TABLE I

| SAMPLES | T (° C.) for 99.5% of original weight | T (° C.) for 99% of original weight | T (° C.) for 95% of original weight | T (° C.) for 90% of original weight |
| --- | --- | --- | --- | --- |
| Standard PMMA #1 | 128° C. | 143° C. | 189° C. | Not tested |
| Standard PMMA #1 | 137° C. | 156° C. | 200° C. | Not tested |
| 0.5% ND | 156° C. | 164° C. | 202° C. | Not tested |
| 0.5% ND | 163° C. | 170° C. | 205° C. | Not tested |

Example 2

Figure 3:
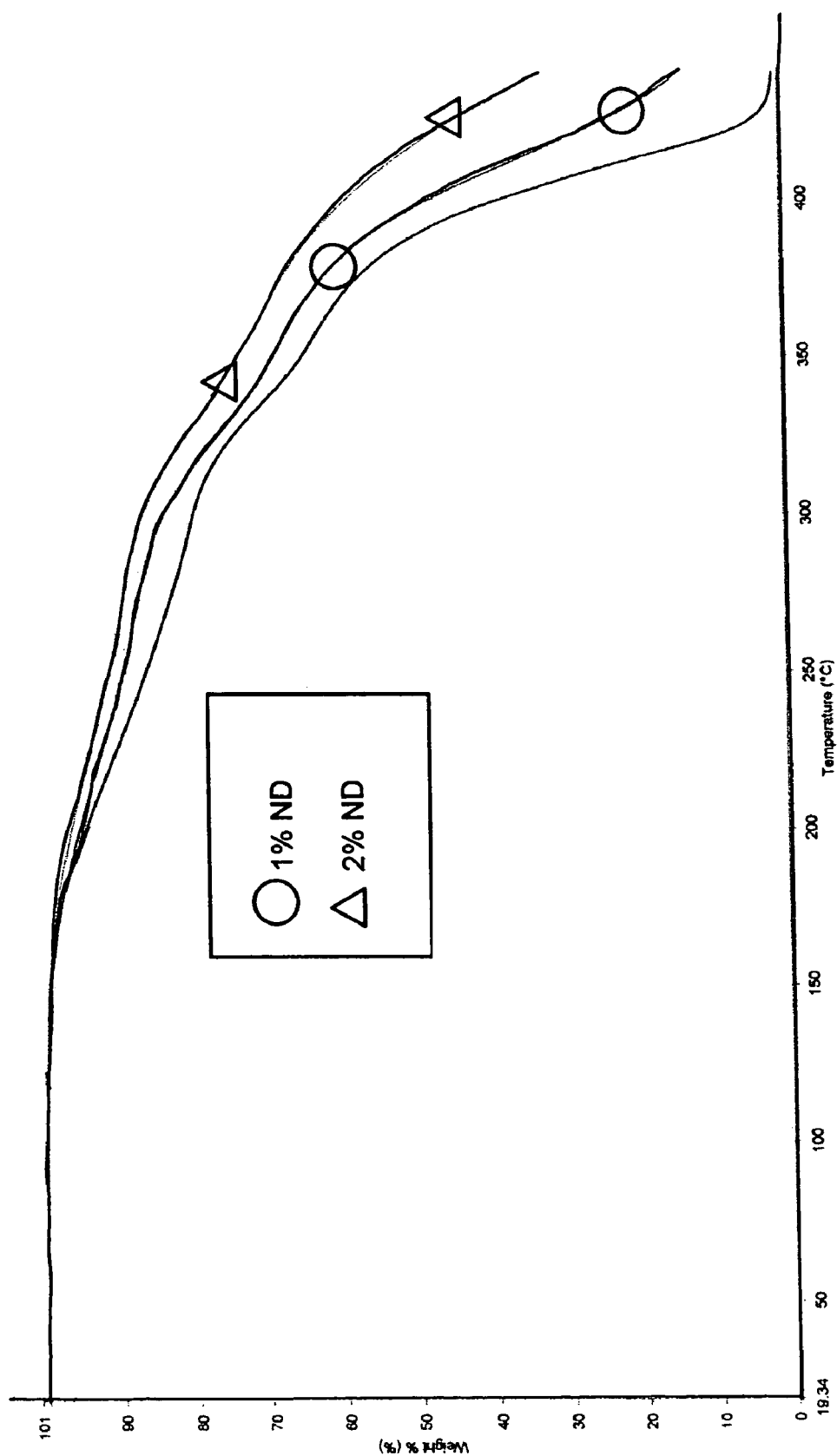
FIG. 3 is a graph of weight loss vs temperature for EXAMPLES 1 and 2.

In order to improve the dispersivity of ND, the ND was obtained in the form of suspensions in anisole from the vendor. The size of ND agglomerates in the suspension obtained from a vendor was smaller than those prepared from ND powder. However, microscopic inspection again revealed that with time the ND in the suspension had coagulated. This is, probably, due to too high concentration of ND in the suspension provided by the vendor (7%). Future experiments should be done with suspensions with lower ND concentrations. The results of the experiments with this material are shown in FIG. 3 and summarized in TABLE II. There was quite a pronounced effect of ND on thermal properties of the polymer. However, the very pronounced effect began at high polymer loss, so that it may not be useful for the purpose of semiconductor applications being considered. Nonetheless, stabilization of the polymer is obtained and further experiments are warranted.

TABLE II

| SAMPLES | T (° C.) for 99.5% of original weight | T (° C.) for 99% of original weight | T (° C.) for 95% of original weight | T (° C.) for 90% of original weight |
| --- | --- | --- | --- | --- |
| Standard PMMA | 140° C. | 151° C. | 193° C. | 226° C. |

TABLE II-continued

| SAMPLES | T (° C.) for 99.5% of original weight | T (° C.) for 99% of original weight | T (° C.) for 95% of original weight | T (° C.) for 90% of original weight |
| --- | --- | --- | --- | --- |
| 1.0% ND | Similar to standard | 153° C. | 200° C. | 242° C. |
| 2.0% ND | Similar to standard | 158° C. | 210° C. | 260° C. |

In general, results from EXAMPLE 1 and EXAMPLE 2 are somewhat different in their overall tendencies (See TABLES I and II). A first difference is the results of PMMA/ND thermal degradation at low polymer weight loss (up to 1%). The effect of ND is much more pronounced in the EXAMPLE 1 of the experiments for this range of polymer percentage weight lost. At the same time, the influence of ND in thermal degradation at higher polymer percentage weight lost (5–10%) is more pronounced for the EXAMPLE 2 of the experiments. While there can be a difference in polymer curing in two sets of experiments (not full solvent evaporation in set 2, for example so that initial lost can be regarded as solvent lost), it should be emphasized that the method of preparation of ND may play an important role. In general, the results were considered encouraging and worth additional experiments.

In each case, the trend is clearly an increase in the thermal stability as measured by weight change versus temperature. For the case of 2% by weight of diamond nanoparticles added to PMMA, the temperature differential for 87% change in weight amounted to approximately a 50° C. increase in temperature. Thus, if PMMA polymer with added diamond nanoparticles were exposed to high temperatures, it appears that it could tolerate a substantially higher temperature before experiencing thermal instabilities compared with unmodified PMMA polymer. It is anticipated that other polymers may behave similarly.

Also, during adhesion test of the polymer film to aluminum foil, it was observed that while pure PMMA was easily pealed off, adhesion of PMMA-ND to the aluminium foil was much stronger, requiring mechanical force in the form of scratching in order to remove film. While it is not quantitative analysis, it gives indirect evidence for enhanced adhesion for polymer film containing ND.

Example 3

In another example, bisbenzocyclobutene (BCB) solution and a solvent, anisole, containing ND particles were mixed and mechanically stirred to insure adequate mixing. Then the mixture was deposited by spin-coating onto an oxidized silicon wafer under normal atmospheric pressure and baked in an oven at 230° C. in a nitrogen atmosphere for 1 hr. The resulting ND content in BCB was 1.5 wt. %. A reference BCB coating without ND was also spin-coated onto an oxidized silicon substrate and baked under similar conditions. In order to perform TGA analysis of the polymer films, the films were removed from the silicon substrate by immersing the samples in a dilute buffered hydrofluoric acid solution for 2–3 hrs to dissolve the oxide layer. After removal from the substrate the films were dried in an oven for 1 hr in a nitrogen atmosphere at 120° C.

The results on the temperature at the maximum mass loss rate for the composite and for pure BCB are summarized in TABLE III for the two different heating rates. The temperature at the maximum mass loss rate for the composite is consistently higher than for the pure BCB and confirm the improved thermal stability of BCB through the addition of ND.

TABLE III

| POLYMER | T at max mass lost, ° C.; Heating 20° C./min | T at max mass lost, ° C.; Heating 10° C./min |
|---|---|---|
| BCB | 190 | 150 |
| BCB-nanodiamond | 220 | 205 |

Example 4

In another example, polyimid (PI) solution and ND solution in anisole were mixed and mechanically stirred for 24 hrs. Then the mixture was spin-on onto a SiO2 wafer under normal atmospheric pressure and baked in an oven at 400° C. in nitrogen atmosphere for 1 hr. The resulting ND content in PI was 1.5 wt. %. A reference PI coating was also spin-on on SiO2 and baked. Then both samples were tested for adhesion of polymer to SiO2 by using scotch tape test. While pure PI film was completely removed from SiO2 by the tape test, the entire film of PI-ND was adherent to the SiO2 after tape adhesion testing. This experiment demonstrates the very high potential of nanodiamond-based polymer composites for improving of adhesion of a polymer to different substrate. Performing similar experiment with BCB and BCB-ND (fabricated according to the procedure in Example 3) it was observed that both films were very well adherent to the substrate and didn't peel off.

While certain illustrative embodiments have been described, it is evident that many alternatives, modifications, permutations and variations will become apparent to those skilled in the art in light of the foregoing description.

What is claimed is:

1. A semiconductor device, comprising:
   a first layer of the semiconductor device;
   a dielectric layer of the semiconductor device situated on the first layer, wherein the dielectric layer comprises an admixture of a polymer and nanoelements;
   a second layer subsequently deposited on top of the dielectric layer so that the dielectric layer is situated between the first and second layer; and
   wherein the nanoelements comprise one or more of the nanoelements selected from the group consisting of diamond nanoparticles, diamond nanorods, silicon carbide nanoparticles and silicon carbide nanorods, and wherein the nanoelements have a largest dimension that is small enough not to interfere with formation of the second layer and any adjacent features.

2. The semiconductor device according to claim 1, wherein the nanoelements comprise diamond nanoparticles produced by detonation synthesis.

3. The semiconductor device according to claim 1, wherein the nanoelements comprise diamond nanorods grown from the vapor phase or etched out of diamond film.

4. The semiconductor device according to claim 1, wherein the nanoelements have a functionalized surface.

5. The semiconductor device according to claim 1, wherein the polymer is selected from the group consisting of PTFE, BCB, PFCB, and polyimide.

6. A dielectric material suitable for use as a semiconductor interlayer dielectric, comprising an admixture of low dielectric polymer with nanoelements, wherein the nanoelements comprise one or more of the nanoelements selected from the group consisting of diamond nanoparticles, diamond nanorods, silicon carbide nanoparticles and silicon carbide nanorods, and wherein the nanoparticles have a largest dimension that is less than approximately 50 nanometers.

7. The material according to claim 6, wherein the nanoelements comprise diamond nanoparticles produced by detonation synthesis, or diamond nanorods grown from the vapor phase or etched out of diamond film.

8. The method according to claim 6, wherein the nanoelements have a surface that is functionalized and wherein silane is used to cross-link the nanoelements with the polymer.

9. The method according to claim 6, wherein the nanoelements have a functionalized surface.

10. The method according to claim 8, wherein the polymer is selected from the group consisting of PTFE, BCB, PFCB, and polyimide.

11. The semiconductor device according to claim 1, wherein the dielectric layer is produced by a method comprising:
   providing a polymer suitable for use as an interlayer dielectric;
   disbursing nanoelements into a solvent solution, wherein the solvent comprises a solvent to the polymer, to produce a colloidal solution;
   admixing the colloidal solution with the polymer; and
   applying the admixture to the first layer to produce the dielectric layer.

12. The device according to claim 1, wherein the nanoelements represent less than about 10% by weight of the cured admixture.

13. The device according to claim 1, wherein the nanoelements represent less than about 0.5 to 5.0% by weight of the cured admixture.

14. The method according to claim 6, wherein the nanoelements have a surface that is functionalized and wherein the surface functional group alone or in combination with a chemical cross-linking agent is used to cross-link the nanoelements with the polymer.

15. A semiconductor device, comprising:
   a first layer of the semiconductor device;
   a dielectric layer of the semiconductor device situated on the first layer, wherein the dielectric layer comprises an admixture of a polymer and nanoelements, wherein the nanoelements represent less than about 10% by weight of the cured admixture;
   a second layer subsequently deposited on top of the dielectric layer so that the dielectric layer is situated between the first and second layer; and
   wherein the nanoelements comprise one or more of the nanoelements selected from the group consisting of diamond nanoparticles, diamond nanorods, silicon carbide nanoparticles and silicon carbide nanorods, and wherein the nanoelements have a largest dimension that is small enough not to interfere with formation of the second layer and any adjacent features, and wherein a primary particle size of the nanoelements is less than approximately 50 nm.

* * * * *